United States Patent
Kake et al.

(10) Patent No.: US 8,958,923 B2
(45) Date of Patent: Feb. 17, 2015

(54) DISTRIBUTED POWER SUPPLY SYSTEM AND CONTROL METHOD THEREOF

(75) Inventors: Nin Kake, Nara (JP); Shinji Miyauchi, Kyoto (JP); Hiroaki Kaku, Shiga (JP); Keiichi Sato, Kyoto (JP); Hiroshi Nagasato, Shiga (JP); Akihito Ootani, Hyogo (JP); Toru Kushisaka, Nara (JP); Motomichi Katou, Nara (JP); Manabu Takahashi, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 510 days.

(21) Appl. No.: 13/504,859

(22) PCT Filed: Aug. 1, 2011

(86) PCT No.: PCT/JP2011/004361
§ 371 (c)(1),
(2), (4) Date: Apr. 27, 2012

(87) PCT Pub. No.: WO2012/017638
PCT Pub. Date: Feb. 9, 2012

(65) Prior Publication Data
US 2012/0218794 A1    Aug. 30, 2012

(30) Foreign Application Priority Data

Aug. 2, 2010  (JP) ................ 2010-173350
Dec. 14, 2010 (JP) ................ 2010-277585

(51) Int. Cl.
*G05F 3/02* (2006.01)
*H02J 3/38* (2006.01)
*G01R 35/00* (2006.01)

(52) U.S. Cl.
CPC . *H02J 3/38* (2013.01); *G01R 35/00* (2013.01); *H02J 3/381* (2013.01); *H02J 3/387* (2013.01)

USPC ........................... 700/286; 700/292

(58) Field of Classification Search
USPC ................... 700/286, 293, 294
See application file for complete search history.

(56) References Cited

U.S. PATENT DOCUMENTS

2009/0128157 A1*  5/2009  Moriya ................ 324/426
2010/0096927 A1*  4/2010  Miyauchi et al. ........... 307/64

FOREIGN PATENT DOCUMENTS

| JP | 09-117066 A | 5/1997 |
| JP | 2002-051464 A | 2/2002 |
| JP | 2005-326245 A | 11/2005 |
| JP | 2009-118673 A | 5/2009 |

OTHER PUBLICATIONS

International Search Report for International Application No. PCT/JP2011/004361, dated Nov. 1, 2011, 1 page.

* cited by examiner

*Primary Examiner* — Kenneth Lo
*Assistant Examiner* — Derrick Boateng
(74) *Attorney, Agent, or Firm* — McDermott Will & Emery LLP

(57) ABSTRACT

A distributed power supply system is configured to execute a process for determining whether or not to permit a diagnostic process in such a manner that it is determined whether or not a difference between a set upper limit value and an actual measurement current value is not less than a load current value, the set upper limit value being a predetermined upper limit value set with respect to a detected current of a current sensor, the measurement current value being detected by the current sensor in a state where the diagnostic process is not executed, and the load current value being a value of a current flowing from a commercial power utility to a power load during execution of the diagnostic process; and if it is determined that the difference is not less than the load current value, the controller permits the diagnostic process.

10 Claims, 11 Drawing Sheets

FIG. 5
INHIBITING PROCESS 1
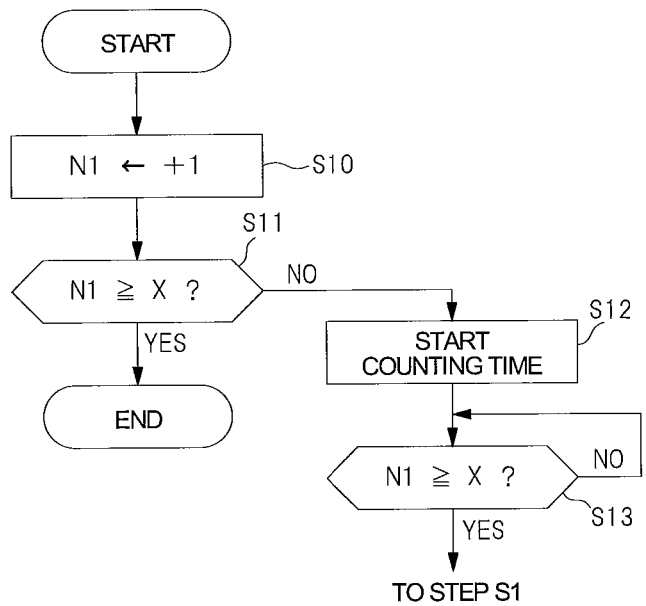
INHIBITING PROCESS 2
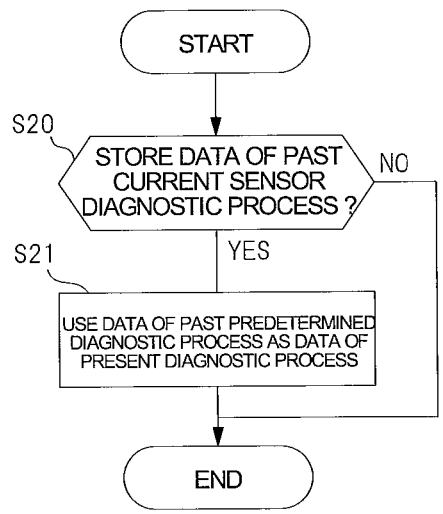

DISTRIBUTED POWER SUPPLY SYSTEM AND CONTROL METHOD THEREOF

This application is a 371 application of PCT/JP2011/004361 having an international filing date of Aug. 1, 2011, which claims priority to JP2010-173350 filed Aug. 2, 2010 and JP2010-277585 filed Dec. 14, 2010, the entire contents of which are incorporated herein by reference.

TECHNICAL FIELD

The present invention relates to a distributed power supply system which supplies electric power to a power demand site separately from a commercial power utility, and a control method thereof.

BACKGROUND ART

Conventionally, as a distributed power supply system, an in-house power generation system disclosed in Patent Literature 1 is proposed. FIG. 10 is a bock diagram showing a configuration of a conventional distributed power supply system disclosed in Patent Literature 1.

As shown in FIG. 10, a distributed power supply system 103 includes a fuel cell apparatus 104 as a distributed power supply apparatus which is interactively connected (interconnected) to commercial power utilities 101 via electric wires (cables). The commercial power utility 101 is a single-phase three-wire AC power supply composed of U-phase, O-phase, and W-phase. Branch wires are extended from the electric wires respectively corresponding to U-phase, O-phase, and W-phase, and are connected to a customer load 102. The distributed power supply system 103 includes current sensors 105a, 105b for detecting magnitudes and directions (positive and opposite (negative) directions)) of an AC current flowing through the U-phase and an AC current flowing through the W-phase, a voltage sensor 106 for detecting a voltage of the commercial power utility 101, and a heater 107 which is an internal load in the system 103. The distributed power supply system 103 further includes a controller 108 for controlling the operation of the system 103, a power integration meter 109 for integrating electric power consumed in the customer load 102 and in the system 103, and a LCD (liquid crystal display) 110 which is a display means and notification means for displaying information such as an electric power value and an abnormal state of the system 103.

In Patent Literature 1, as an installation direction of the current sensors 105a, 105b, for example, an installation direction in which a current flowing from the commercial power utility 101 toward the fuel cell apparatus 104 is detected as a positive current is referred to as a positive installation direction.

The controller 108 includes a power calculating section 111, a current sensor installation direction determiner section 112, a nonvolatile memory 113, a sign inverting section 114, and a heater control section 115. The power calculating section 111 calculates the electric power consumed in the U-phase based on a detected value of the current sensor 105a and the electric power consumed in the W-phase based on a detected value of the current sensor 105b. The current sensor installation direction determiner section 112 determines the installation directions of the current sensors 105a, 105b with respect to the electric wires. The nonvolatile memory 113 is a memory means for storing data of result of determination performed by the current sensor installation direction determiner section 112. The sign inverting section 114 properly corrects positive/negative signs of values of electric power consumption calculated by the power calculating section 111 based on information relating to the installation directions of the current sensors 105a, 105b stored in the nonvolatile memory 113. The heater control section 115 controls the electric power supplied to the heater 107.

In the distributed power supply system 103, during an ON-state of a power supply, the controller 108 determines the installation directions of the current sensors 105a, 105b. More specifically, the controller 108 causes the heater control section 115 to turn ON the heater 107 in a state where the fuel cell apparatus 104 is generating no electric power, to supply the electric power from the commercial power utility 101 to the fuel cell apparatus 104 via the electric wires. As a result, the fuel cell apparatus 104 consumes the electric power. Therefore, the directions of the currents detected by the current sensors 105a, 105b should be decided as particular directions, and the electric power consumed by the customer load increases temporarily. During this time (during a state in which the heater 107 is ON), the current sensors 105a, 105b obtain current values, and at the same time, the voltage sensor 106 obtains voltage values. The power calculating section 111 calculates the electric power value at the U-phase and the electric power value at the W-phase based on the current values and the voltage values.

Based on the calculated electric power values, the current sensor installation direction determiner section 112 determines the installation directions of the current sensors 105a, 105b, and the nonvolatile memory 113 stores data of results of determination corresponding to the U-phase and the W-phase, respectively. This determination is performed as follows.

During the state where the fuel cell apparatus 104 is generating no electric power, as described above, by turning ON the heater 107, the electric power is supplied from the commercial power utility 101 to the fuel cell apparatus 104. If the installation direction of the current sensor 105a(105b) is correct, a positive current value is detected, and the electric power value calculated by the power calculating section 111 is a positive value. Therefore, in determination as to the installation direction, if the electric power value calculated by the power calculating section 111 is not less than a predetermined value (e.g., 0 W), it can be determined that the current sensor 105a (105b) is installed in a positive direction, while if the electric power value calculated by the power calculating section 111 is less than the predetermined value, it can be determined that the current sensor 105a (105b) is installed in an opposite (negative) direction. Determination information (installation direction information) corresponding to each of the U-phase and the W-phase, for example, the positive direction or the opposite direction, is stored in the nonvolatile memory 113.

After the determination information is obtained and stored, the controller 108 causes the heater control section 115 to turn OFF the heater 107, and thus terminates determination as to the installation direction of the current sensor 105a (105b). Thereafter, the controller 108 causes the sign inverting section 114 to correct (invert the sign) the electric power value calculated for each of the U-phase and the W-phase based on the installation direction information of the current sensor 105a(105b). The power integration meter 109 integrates the corrected electric power value and the LCD 110 displays and outputs the integrated electric power value.

In general, each of the current sensors 105a, 105b has a region in which a relationship between a current value which is a detected target and an output voltage value of the sensor is linear and a region in which the relationship is non-linear. FIG. 11 is a graph showing a relationship between a detected current value and an output voltage value in a current sensor applied to, for example, the conventional distributed power supply system disclosed in Patent Literature 1. As shown in FIG. 11, the current sensor has a characteristic in which the output voltage value changes linearly with respect to the detected current value in a region in which the current value is less than a predetermined value and changes non-linearly in a region in which the current value is not less than the predetermined value. In other words, the current sensor functions as a linear sensor when the detected current value is less than the predetermined value, whereas the current sensor does not function as the linear sensor when the detected current value is not less than the predetermined value, in which state, the output voltage value is substantially constant regardless of a change in the current value, and the current sensor is unable to measure the current value.

In particular, the electric power consumed by the customer load 102 is not constant but changes significantly all the time. Therefore, in some cases, the current value changes beyond a limit value of the current sensor 105a (105b) as a liner sensor. In this case, detecting accuracy of the current value decreases significantly. In this way, the current sensor has a range of a detected current value in which accuracy is guaranteed and the above described predetermined value is its upper limit value (detected upper limit value).

Patent Literature 1: Japanese Laid-Open Patent Application Publication No. 2009-118673

SUMMARY OF THE INVENTION

Technical Problem

In recent years, with an increasing demand for environmental conservation, consideration has been given to installation of distributed power supply systems as in-house power generation apparatuses in schools, hospitals, and others. In objects such as schools and hospitals, greater contracted current values (hereinafter referred to as "contracted upper limit values") are frequently set than in individual homes. The "contracted upper limit value" is defined as an upper limit current value of a usable current which is decided by contact with a power company for each object. If the current used exceeds this contracted upper limit value, an excess current protection device is typically actuated to cut off electric power supplied from a commercial power utility.

When the distributed power supply system is incorporated into the object having a relatively great contracted upper limit value, the current sensor may be used at a value near its detected upper limit value. In this case, in the conventional system configuration of FIG. 10, when the heater 107 is turned ON to perform the above determination as to the current sensor, the current flowing through the electric wire may increase temporarily and exceed the detected upper limit value of the current sensor. Therefore, it may become impossible to accurately measure the current value using the current sensor, and as a result, it may become impossible to accurately perform determination as to the current sensor.

If the installation direction of the current sensor cannot be determined correctly, correction such as a sign inverting process cannot be performed. Therefore, there may be a chance that calculated data of the electric power value has an error, and erroneous integrated electric power value is displayed on the LCD 110. The use of a current sensor having a greater detected upper limit value may be able to solve the above problem. However, since such a current sensor has a greater outer shape in size, it cannot be installed easily. In addition, cost increases. Therefore, there is a need for another method for solving this problem.

In view of the above mentioned circumstances, an object of the present invention is to provide a distributed power supply system which is capable of more accurately performing an diagnosis process relating to a current sensor, such as determination as to an installation direction of the current sensor, and a control method thereof.

Solution to Problem

According to the present invention, a distributed power supply system which supplies electric power to a power demand site separately from a commercial power utility, comprising: a distributed power supply apparatus connected to the commercial power utility via an electric wire and configured to supply the electric power to the power demand site; a power load supplied with the electric power from the commercial power utility via the electric wire; a current sensor connected to the electric wire and configured to detect a magnitude and a direction of a current flowing through the electric wire; and a controller configured to execute a diagnostic process of the current sensor based on a difference between a detected current value of the current sensor in a state where the electric power is supplied to the power load and a detected current value of the current sensor in a state where the electric power is not supplied to the power load; wherein the controller executes a process for determining whether or not to permit the diagnostic process in such a manner that the controller determines whether or not a difference between a set upper limit value and an actual measurement current value is not less than a load current value, the set upper limit value being a predetermined upper limit value set with respect to a detected current of the current sensor, the actual measurement current value being detected by the current sensor in a state where the diagnostic process is not executed, and the load current value being a value of a current flowing from the commercial power utility to the power load during execution of the diagnostic process; and if it is determined that the difference is not less than the load current value, the controller permits the diagnostic process.

In accordance with this configuration, the predetermined set upper limit value is compared to a sum of the actual measurement current value in the state where the diagnostic process is not executed and the load current value in the state where it is assumed that the diagnostic process is executed. And, the diagnostic process is not executed when the sum is not less than the set upper limit value, while the diagnostic process can be executed only when the sum is less than the predetermined value. Because of this, by setting the set upper limit value to a proper value, the diagnostic process can be carried out only in the case where detecting accuracy of the current sensor can be guaranteed. This makes it possible to accurately correct the electric power value based on the result of the diagnostic process. As used herein, the "power demand site" is a load supplied with the electric power from the distributed power supply system and from the commercial power utility, and includes, for example, a load which belongs to an individual home, a school, or a hospital.

The set upper limit value may be a detected upper limit value which is an upper limit value up to which the current sensor exhibits linearity between the detected current value of the current sensor and an output voltage value of the current sensor, a contracted upper limit value defined as a value which is not greater than the detected upper limit value as an upper limit value of the current supplied from the commercial power utility to the power demand site, or a predetermined value less than the contracted upper limit value.

In accordance with this configuration, for example, when the set upper limit value is the detected upper limit value, the diagnostic process can be carried out only in the case where detecting accuracy of the current sensor can be guaranteed. Also, when the set upper limit value is the contracted upper limit value which is defined as the value which is not greater than the detected upper limit value, it is possible to surely avoid that the sum of the actual measurement current value and the load current value exceeds the detected upper limit value, and hence to surely guarantee the detecting accuracy of the current sensor during execution of the diagnostic process. Furthermore, when the set upper limit value is the predetermined value less than the contracted upper limit value, the process for determining whether or not permit the diagnostic process can be executed more precisely.

If it is determined that the difference is less than the load current value in the process for determining whether or not to permit the diagnostic process, the controller may execute the process for determining whether or not to permit the diagnostic process again at a predetermined timing.

In accordance with this configuration, even in a case where the diagnostic process cannot be executed, due to a temporary increase in the actual measurement current value, an attempt may be made to execute it again at a different timing. This can increase a possibility that the diagnostic process can be executed. In some cases, the actual measurement current value increases temporarily due to, for example, a change in the electric power consumption at the power demand site, and thereby it may be determined that the diagnostic process is inhibited. Even in such cases, the process for determining whether or not to permit the diagnostic process is executed again at a timing when the actual measurement current value is smaller in magnitude. As a result, the diagnostic process can be executed.

If it is determined that the difference is less than the load current value in the process for determining whether or not to permit the diagnostic process, the controller may inhibit the diagnostic process, and uses data of result of a past diagnostic process as data of result of a present diagnostic process.

In accordance with this configuration, if the present diagnostic process (diagnostic process to be executed at a present time) is inhibited, the electric power value can be corrected and integrated using data of the result of the past diagnostic process (diagnostic process executed at a past time). Thus, the system can be operated smoothly.

The controller may execute the process for determining whether or not to permit the diagnostic process before start-up of the distributed power supply apparatus, and wherein (1) if it is determined that the difference is not less than the load current value, the controller may execute the diagnostic process, and may then start-up the distributed power supply apparatus, or wherein (2) if it is determined that the difference is less than the load current value, the controller may decide that the data of result of the past diagnostic process is used as the data of the result of the present diagnostic process, and may then start-up the distributed power supply apparatus.

In accordance with this configuration, the distributed power supply apparatus is started-up after the electric power value is corrected based on the result of the diagnostic process. Therefore, the integrated electric power value which reflects the result of the diagnostic process can be output (displayed) from the begging of the operation of the distributed power supply apparatus.

The current sensor may include a ring core into which the electric wire is inserted; a winding wire wound around the ring core; and a resistive element connected between both ends of the winding wire; and the detected upper limit value may be set to correspond to an upper limit voltage value in an allowable applied voltage range of the resistive element.

In accordance with this configuration, it is possible to suppress the current value from exceeding the detected upper limit value by execution of the diagnostic process. This makes it possible to suppress the voltage exceeding the upper limit voltage value in the allowable applied voltage range from being applied to the resistive element, and hence suppress degradation of the resistive element.

The diagnostic process may include a sensor state detecting process for detecting at least one of states which are (1) an installation direction of the current sensor; (2) a state of a position of the current sensor installed on the electric wire; (3) a state of a failure of the current sensor; and (4) a state in which the current sensor is attached on or detached from the electric wire.

In accordance with this configuration, the state of the current sensor can be detected, and the electric power value can be corrected more accurately.

The controller may be configured to execute the diagnostic process three or more times in succession at specified time intervals in such a manner that at least one time interval is set to a time interval which is other than an integral multiple of another time interval.

In accordance with this configuration, more accurate diagnostic process result can be attained by performing the diagnostic process plural times which are three or more times. By setting the timing intervals as described above, it is possible to avoid a situation in which the timings at which the diagnostic process is executed plural times are synchronized with a change cycle of the electric power supplied from the commercial power utility to the power demand site. As a result, more accurate diagnostic process result can be attained.

The distributed power supply apparatus may include a power generation unit for generating DC power, and an inverter which converts the DC power generated by the power generation unit into AC power and outputs the AC power to the electric wire; and the power load may be a power heater supplied with the AC power via the inverter.

In accordance with this configuration, it is not necessary to provide a heater for exclusive use in the diagnostic process. As the above heater, a heater which is provided to consume surplus electric power (AC power) generated in the power generation unit may be used. As the power generation unit, a fuel cell apparatus, a solar light power generation apparatus, a solar heat power generation apparatus or a wind power generation apparatus may be used.

According to the present invention, there is provided a method of controlling a distributed power supply system including a distributed power supply apparatus which supplies electric power to a power demand site separately from a commercial power utility, a current sensor for detecting a current flowing through an electric wire connecting the commercial power utility and the distributed power supply apparatus to each other; and a power load supplied with the electric power from the commercial power utility via the electric wire, the method comprising the steps of: obtaining a set upper limit value which is a predetermined upper limit value set with respect to a detected current of the current sensor; obtaining an actual measurement current value detected by the current sensor in a state where a predetermined diagnostic process relating to diagnosis of the current sensor is not executed; obtaining a load current value which is a value of a current flowing from the commercial power utility to the power load during execution of the diagnostic process; determining whether or not a difference between the set upper limit value and the actual measurement current value is not less than the load current value; and permitting the diagnostic process if it is determined that the difference is not less than the load current value.

Advantageous Effects of the Invention

In accordance with a distributed power supply system and a control method thereof of the present invention, a process for determining whether or not to permit a diagnostic process is executed, and then the diagnostic process is permitted only in a case where detecting accuracy of a current sensor can be guaranteed. Therefore, it is possible to attain a more accurate diagnostic result and a more accurate electric power value.

BRIEF DESCRIPTION OF THE DRAWINGS

FIG. 5 is a flowchart showing the operation of the controller in inhibiting processes.

DETAILED DESCRIPTION OF THE PREFERRED EMBODIMENTS

Hereinafter, embodiments of the present invention will be described with reference to the drawings. The present invention is in no way limited to the embodiments below.

Embodiment 1

Figure 1:
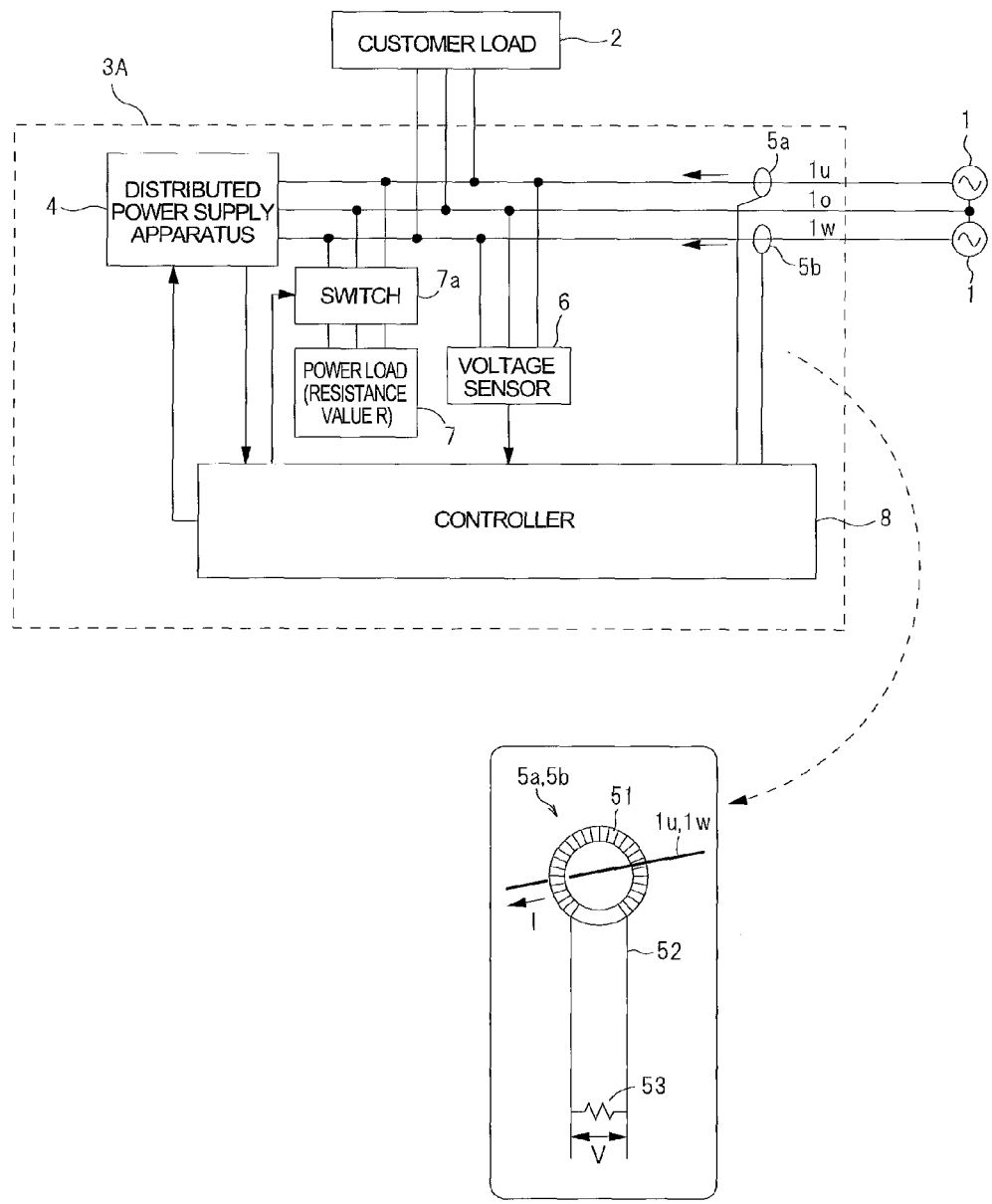
FIG. 1 is a block diagram showing a configuration of a distributed power supply system according to Embodiment 1 of the present invention.

FIG. 1 is a block diagram showing a configuration of a distributed power supply system according to Embodiment 1 of the present invention. As shown in FIG. 1, a distributed power supply system 3A of the present embodiment is situated between a commercial power utility 1 and a customer load (power demand site) 2. Although in the present embodi-ment, the commercial power utility 1 is a single-phase three-wire AC power supply composed of U-phase, O-phase and W-phase as the commercial power utility 1, a single-phase two-wire circuit or a two-phase three-wire circuit may be used. The customer load 2 is defined as equipment which consumes electric power, for example, a laundry machine installed at a customer. The customer includes general homes, schools, hospitals, etc.

The distributed power supply system 3A includes a distributed power supply apparatus 4 which outputs AC power and current sensors 5a, 5b. The distributed power supply apparatus 4 is connected to the commercial power utility 1 via electric wires 1u, 1o, and 1w respectively corresponding to U-phase, O-phase and W-phase. The distributed power supply apparatus 4 may be a power generation unit such as a fuel cell apparatus, a solar light power generation apparatus, a solar heat power generation apparatus, or wind power generation apparatus. In the case of using these power generation units, an inverter for converting generated DC power into AC power is used together. The current sensors 5a, 5b are installed in, for example, a distribution board installed at a demarcation point in the commercial power utility 1 and are configured to detect magnitudes and directions of currents flowing through the U-phase and the W-phase.

The distributed power supply system 3A further includes a voltage sensor 6 for detecting a voltage of the commercial power utility 1, a power load 7 (resistance value R) which constitutes an internal load in the system 3A and is separate from the customer load 2, and a switch 7a for connecting/disconnecting (hereinafter turning ON/OFF) the power load 7 to/from the electric wires 1u, 1o, 1w. Therefore, when the switch 7a is turned ON, a current flows through the power load 7 via the electric wires 1u, 1o, 1w. As the power load 7, a heater may be used. In particular, when the distributed power supply system 3A includes a heater for consuming surplus electric power generated in the power generation unit as the distributed power supply apparatus 4, the heater may be used as the power load 7.

The distributed power supply system 3A further includes a controller 8 for controlling the operation of the components in the system 3A. For example, as shown in FIG. 1, the controller 8 receives detection signals from the current sensors 5a, 5b and the voltage sensor 6, and outputs a drive signal for turning ON/OFF the switch 7a to the switch 7a. In addition, the controller 8 outputs a control signal for controlling the operation in each phase of start-up, power generation operation or shut-down of the distributed power supply apparatus 4. Further, the controller 8 executes a predetermined program stored in an internal memory to execute a process for determining whether or not to permit a diagnostic process as described later. According to a result of the determination, the controller 8 performs the diagnostic process (current sensor diagnostic process) relating to the current sensors 5a, 5b.

In the configuration shown in FIG. 1, on the electric wires from the distributed power supply apparatus 4 to the commercial power utility 1, the switch 7a, the customer load 2, the voltage sensor 6, and the current sensors 5a, 5b are provided in this order when viewed from the distributed power supply apparatus 4.

An electric characteristic of the current sensors 5a, 5b will now be described. Each of the current sensors 5a, 5b of the present embodiment may have a configuration shown in a lower portion of FIG. 1. The current sensor 5a includes a ring core 51 into which the electric wire 1u is inserted, a winding wire 52 wound around the ring core 51, and a resistive element 53 connected between both ends of the winding wire 52, while the current core 5b includes a ring core 51 into which the electric wire 1w is inserted, a winding wire 52 wound around the ring core 51, and a resistive element 53 connected between both ends of the winding wire 52. In the current sensors 5a (5b), when ACI flows through the electric wire 1u (1w), an inductive current flows through the winding wire 52 by a magnetic field generated in the ring core 51, and a voltage (electric potential difference) V is generated between both ends of the resistive element 53. Therefore, by detecting the voltage V, the magnitude and direction of the current flowing through the electric wire 1u (1w) can be detected.

Figure 11:
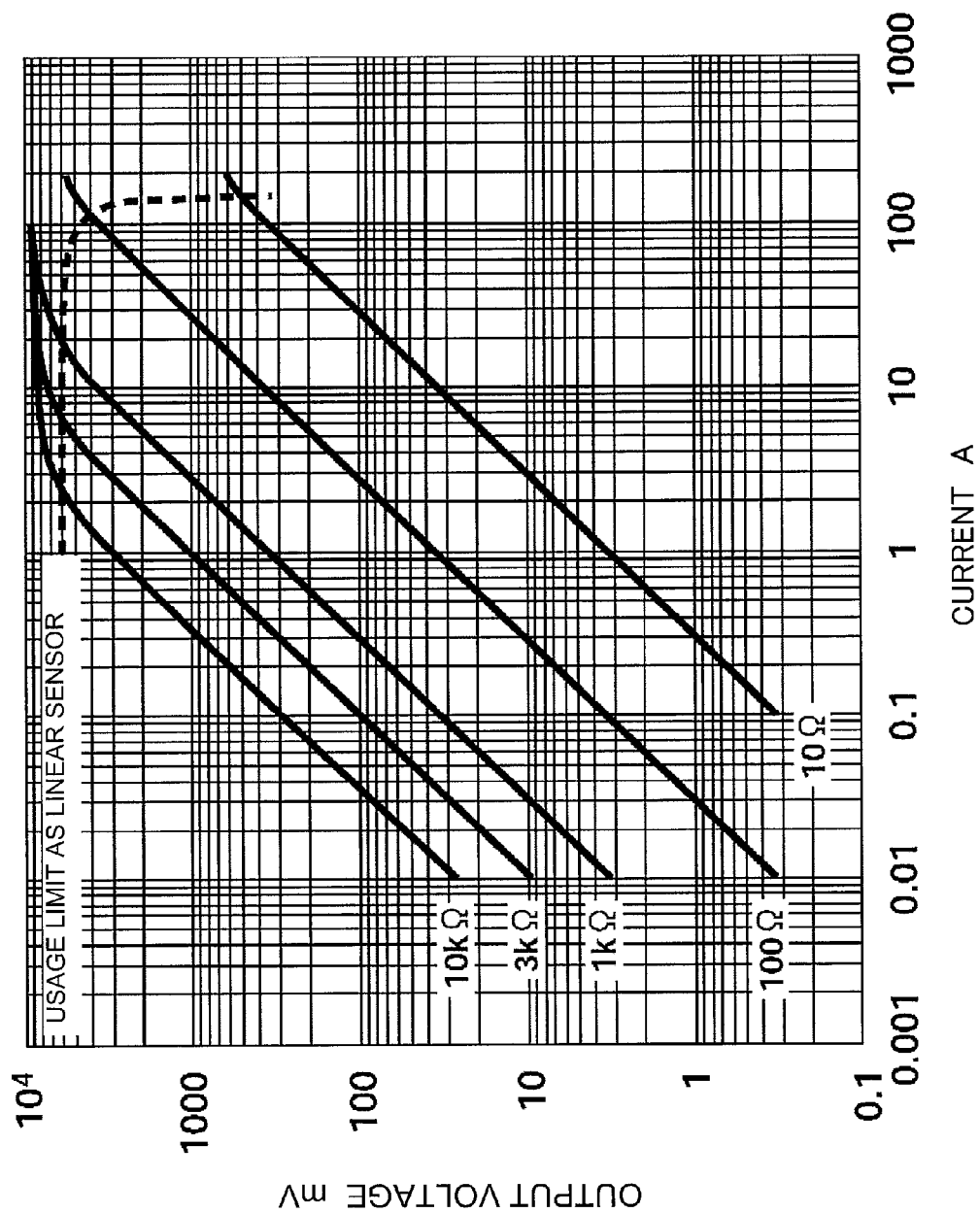
FIG. 11 is a graph showing the relationship among a detected current value and an output voltage value in a current sensor applied to the conventional distributed power supply system.

For the resistive element 53 included in the current sensor 5a (5b), typically, a predetermined allowable applied voltage range is set. Within this range, there is a linear relationship between the value of the current flowing through the resistive element 53 and the voltage V generated in the resistive element 53. However, if a current exceeding an upper limit voltage value of the allowable applied voltage range flows, then the relationship between the current value and the voltage may exhibit non-linearity, and degradation of the resistive element 53 may possibly progress. In other words, when the value I of the current flowing through the electric wire 1u (1w) is less than a predetermined value, the relationship between the current value I and the voltage V exhibits linearity. On the other hand, when the value I is not less than the predetermined value, the relationship between the current value I and the detected value (voltage V) output from the current sensor 5a (5b) exhibits non-linearity (see FIG. 11).

Hereinafter, the above stated predetermined value is referred to as "detected upper limit value." As can be clearly seen from the above, the detected upper limit value is the value of the current flowing through the electric wire when the voltage V of the resistive element 53 is an upper limit voltage value in the allowable applied voltage range. The range (linearity measurement range) of the current value I corresponding to a linear change in the detected value (voltage V) of the current sensor 5a (5b) with respect to the value I of the current flowing through the electric wire 1u (1w), i.e., a range less than the detected upper limit value, is referred to as "linear range," and a range which is not less than the detected upper limit value is referred to as "non-linear range." The detected upper limit value of the current value I is stored in the internal memory (not shown) in the controller 8 as one of set current values which are set with respect to the detected current value of the current sensor 5a (5b).

For each of power demand sites (objects) such as homes, schools, and hospitals, an upper limit value (hereinafter referred to as "contracted upper limit value") of a current supplied from commercial power utility is set, which upper limit value is decided by contract with power company. For example, in an individual home, the contracted upper limit value is set to a predetermined value which is not greater than the detected upper limit value of the current sensor. If the current used in the power demand site exceeds this contracted upper limit value, an excess current protection device is typically actuated to cut off the electric power supplied from the commercial power utility. The contracted upper limit value is stored in the internal memory (not shown) in the controller 8 as one of the set current values which are set with respect to the detected current value of the current sensor 5a (5b), together with the detected upper limit value.

(Process for Determining Whether or not to Permit Diagnostic Process)

Next, description will be given of a process for determining whether or not to permit the diagnostic process, which is executed by the controller 8.

If the current sensor 5a(5b) in the distributed power supply system 3A is installed on the electric wire 1u(1w) in an incorrect direction, or its output terminal is connected to the controller 8 incorrectly, the positive/negative sign of the detected current value is reversed. For example, in the present embodiment, current directions are set in such a manner that a direction of the current flowing from the commercial power utility 1 toward the distributed power supply apparatus 4 is "positive" and a direction of the current in a reverse electric power flow is "negative." The set current directions are stored in the controller 8. However, if the installation direction of the current sensor 5a (5b) or connection of the current sensor 5a (5b) is incorrect, the direction of the detected current is opposite to the above set direction. Therefore, in the system 3A, the installation state of the current sensor 5a (5b) is obtained, and a current sensor diagnostic process including various processes such as correction based on the obtained installation state is executed.

In the current sensor diagnostic process, the switch 7a is turned ON/OFF to supply the electric power from the commercial power utility 1 to the power load 7, and during the supply of the electric power, the current sensor 5a (5b) detects the value of the current flowing through the electric wire 1u (1w) (see Embodiment 2 regarding detail of the current sensor diagnostic process). There may be a chance that, because of execution of the current sensor diagnostic process, the current flowing through the electric wire 1u (1w) increases and exceeds the detected upper limit value of the current sensor 5a (5b). To avert such a situation and execute the current sensor diagnostic process correctly, in the distributed power supply system 3A of the present embodiment, a process for determining whether or not to permit the diagnostic process is executed to determine whether or not to permit the current sensor diagnostic process.

Figure 2:
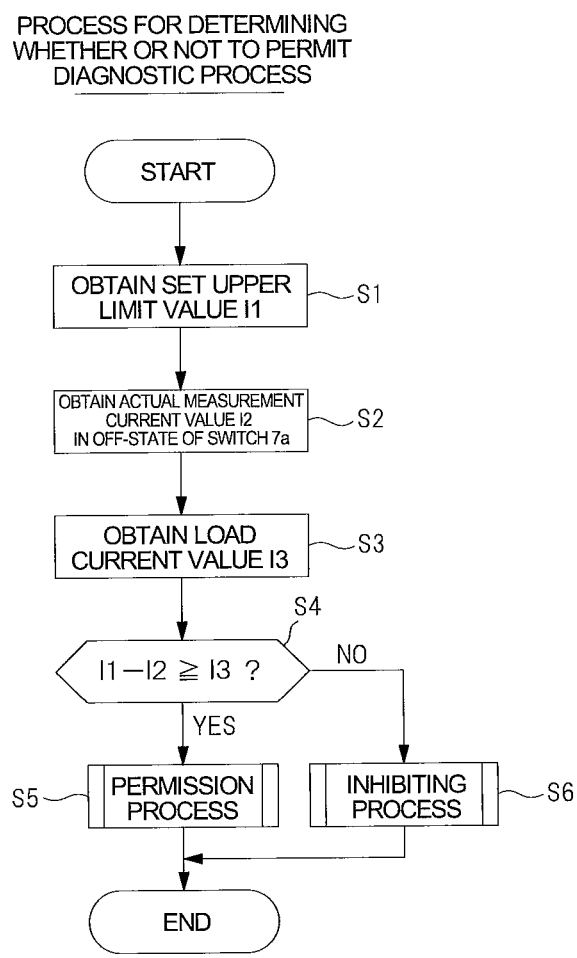
FIG. 2 is a flowchart showing the operation of a controller 8 in a process for determining whether or not to permit a diagnostic process.

FIG. 2 is a flowchart showing the operation of the controller 8 in the process for determining whether or not to permit the diagnostic process. As shown in FIG. 2, initially, the controller 8 obtains the set upper limit value (detected upper limit value or contracted upper limit value) I1 of the current sensor 5a (5b) stored in the internal memory of the controller 8 (step S1) and obtains an actual measurement current value I2 in an OFF-state of the switch 7a (step S2). That is, in step S2, in a state where the current sensor diagnostic process is not executed (OFF-state of switch 7a), the values I2 of the currents flowing through the electric wires 1u, 1w, respectively, are obtained individually based on the detected values of the current sensors 5a, 5b. Then, a value I3 of a load current flowing though the power load 7 in a case where the switch 7a is assumed to be turned ON to initiate the current sensor diagnostic process, is obtained (step S3). As the load current value I3, an almost correct value can be predicted from a load capacity (resistance R) of the power load 7 and the actual measurement current value I2.

Then, it is determined whether or not a difference between the set upper limit value I1 and the actual measurement current value I2 is not less than the load current value I3, using each of the current values obtained as described above (step S4). If it is determined that the difference between the set upper limit value I1 and the actual measurement current value I2 is not less than the load current value I3 (step S4: YES), a permission process is executed (step S5), while if it is determined that the difference between the set upper limit value I1 and the actual measurement current value I2 is less than the load current value I3 (step S4: NO), an inhibiting process is executed (step S6).

Figure 3:
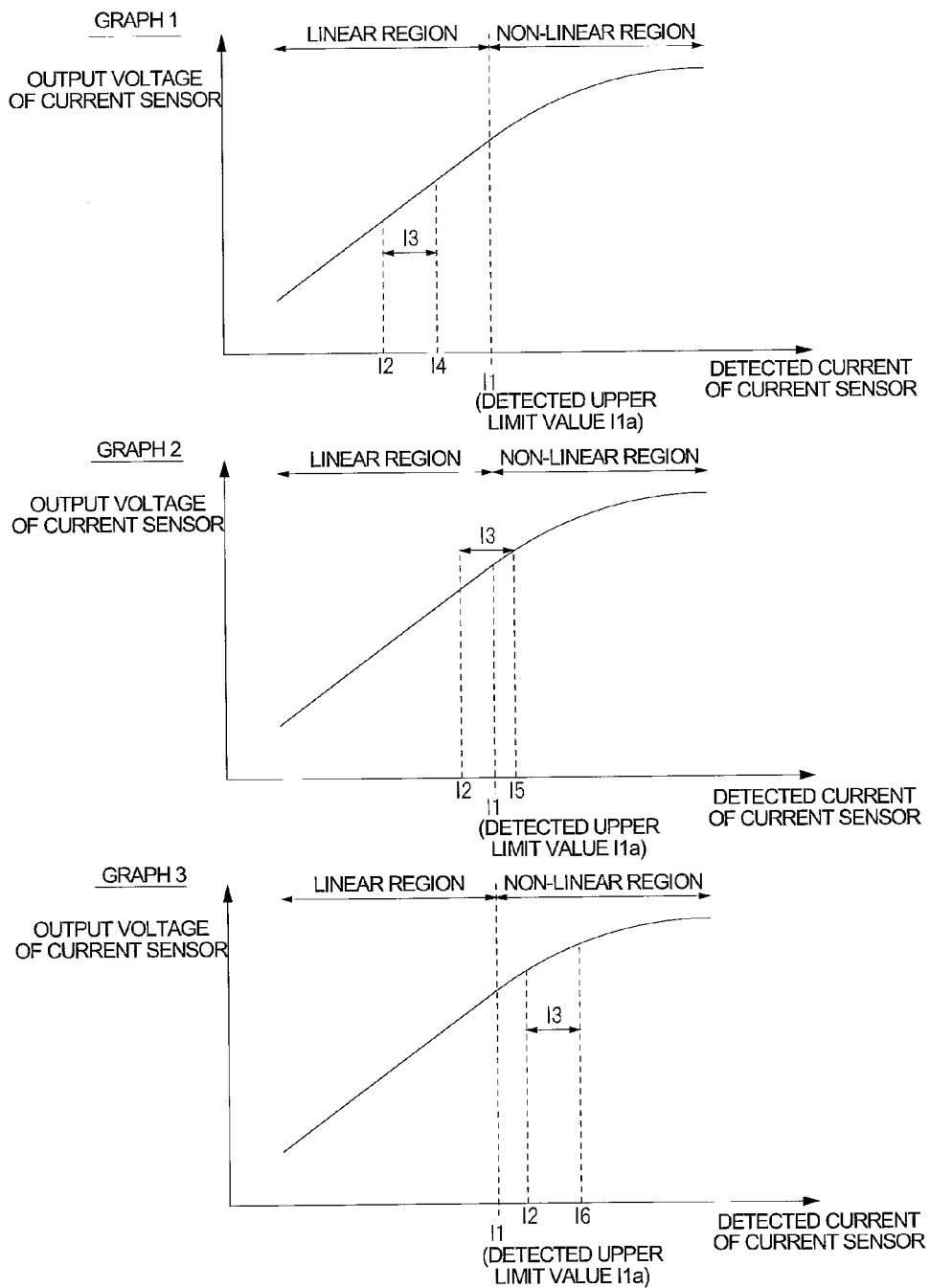
FIG. 3 is a graph showing the relationship among a detected upper limit value selected as a set upper limit value, an actual measurement current value, and a load current value.

FIG. 3 is a graph showing the relationship among a detected upper limit value I1a selected as the set upper limit value I1, the actual measurement current value I2, and the load current value I3. FIG. 3 depicts a graph 1 showing a case where a difference between the detected upper limit value I1a and the actual measurement current value I2 is not less than the load current value I3 and graphs 2 and 3 showing cases where the difference between the detected upper limit value I1a and the actual measurement current value I2 is less than the load current value I3. As can be seen from the graph 1, the difference (I1a-I2) between the detected upper limit value I1a and the actual measurement current value I2 is not less than the load current value I3. Therefore, even when the switch 7a is ON, a current value I4 (I2+I3) detected by the current sensor 5a (5b) is less than the detected upper limit value I1a, and therefore the permission step (step S5) is executed.

By comparison, as can be seen from the graph 2, the difference (I1a-I2) between the detected upper limit value I1a and the actual measurement current value I2 is less than the load current value I3. As can be seen from the graph 3, the actual measurement current value I2 is greater than the detected upper limit value I1a, and therefore the difference (I1a-I2) between the detected upper limit value I1a and the actual measurement current value I2 is less than the load current value I3. Thus, if the switch 7a is ON, a current value I5 detected by the current sensor 5a (5b) is greater than the detected upper limit value I1a, and a current value I6 detected by the current sensor 5a (5b) is greater than the detected upper limit value I1a. Therefore the inhibiting process (step S6) is executed.

Figure 4:
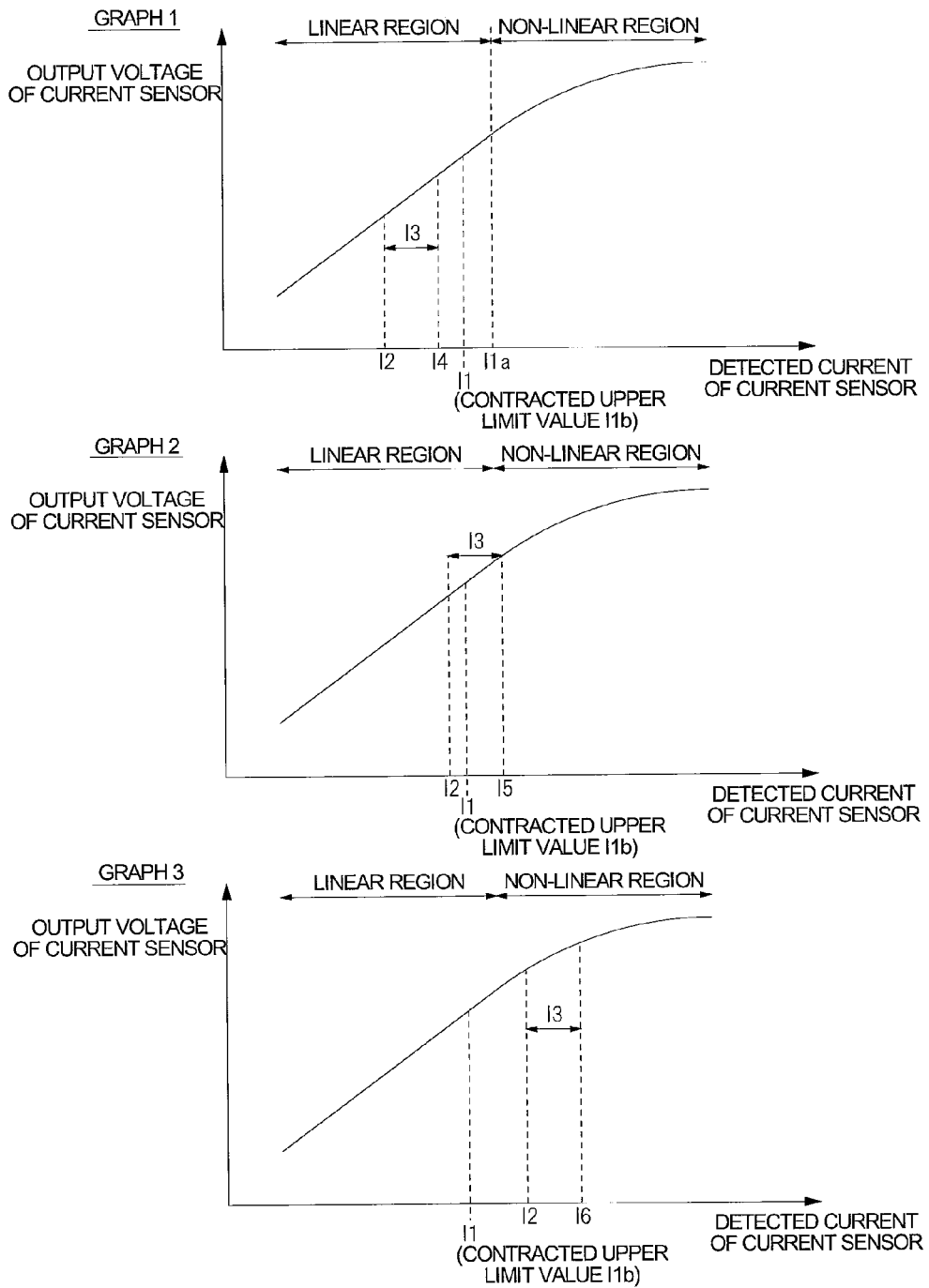
FIG. 4 is a graph showing the relationship among a contracted upper limit value selected as the set upper limit value, the actual measurement current value, and the load current value.

FIG. 4 is a graph showing the relationship among a contracted upper limit value I1b selected as the set upper limit value I1, the actual measurement current value I2, and the load current value I3. FIG. 4 depicts a graph 1 showing a case where the difference between the contracted upper limit value I1b and the actual measurement current value I2 is not less than the load current value I3 and graphs 2 and 3 showing cases where the difference between the contracted upper limit value I1b and the actual measurement current value I2 is less than the load current value I3. In the graph 1, as represented by FIG. 4, the contracted upper limit value I1b is set to a value which is not greater than the detected upper limit value I1a of the current sensor 5a(5b).

As can be seen from the graph 1, a difference (I1b-I2) between the contracted upper limit value I1b and the actual measurement current value I2 is not less than the load current value I3. Therefore, even if the switch 7a is ON, a current value I4 (I2+I3) detected by the current sensor 5a (5b) is less than the contracted upper limit value I1b, and is surely less than the detected upper limit value I1a, and therefore the permission step (step S5) is executed.

By comparison, as can be seen from the graph 2 in FIG. 4, the difference (I1b-I2) between the contracted upper limit value I1b and the actual measurement current value I2 is less than the load current value I3. As can be seen from the graph 3, the actual measurement current value I2 is greater than the contracted upper limit value I1b, and therefore the difference (I1b-I2) between the contracted upper limit value I1b and the actual measurement current value I2 is less than the load current value I3. Therefore, if the switch 7a is ON, the current value I5 detected by the current sensor 5a (5b) is greater than the contracted upper limit value I1b, and the current value I6 detected by the current sensor 5a (5b) is greater than the contracted upper limit value I1b. For example, depending on how the electric power consumed in the customer load 2 changes, the current value I5 (I6) may possibly exceed the detected upper limit value I1a. Therefore, in this case, the inhibiting process (step S6) is executed.

As described with reference to FIGS. 3 and 4, as the set upper limit value, the detected upper limit value and the contracted upper limit value may be used. Alternatively, a predetermined value which is less than the contracted upper limit value may be used. In this case, since the value which is less than the contracted upper limit value is a determination reference value, the process for determining whether or not to permit the diagnostic process can be executed more precisely. In a further alternative, a predetermined value which is less than the detected upper limit value and the contracted upper limit value may be set as the set upper limit value, irrespective of a magnitude relationship between the detected upper limit value and the contracted upper limit value. The process for determining whether or not to permit the diagnostic process in the case where the above predetermined value is the set upper limit value I1 is similar to that described with reference to FIGS. 2 to 4.

In the present embodiment, as the permission process of step S5, specifically, a process for permitting the current sensor diagnostic process is executed. As a suitable example of the inhibiting process in step S6, there are repetition of execution of the process for determining whether or not to permit the diagnostic process (inhibiting process 1) and a method which uses data of a result of a past current sensor diagnostic process (current sensor diagnostic process executed at a past time) as data of a result of a present current sensor diagnostic process (current sensor diagnostic process executed at a present time (inhibiting process 2).

FIG. 5 is a flowchart showing the operation of the controller 8 in the inhibiting process 1 and the inhibiting process 2. Firstly, an example of the inhibiting process 1 of FIG. 5 will be described. In the inhibiting process 1, a counter in the controller 8 increments a counter value N1 by 1 (step S10). It is determined whether or not the counter value N1 is not less than a predetermined value X (step S11). The predetermined value X is an upper-limit number of times step S1 and the following steps in the process for determining whether or not to permit the diagnostic process is repeated if the difference between the set upper limit value I1 and the actual measurement current value I2 is less than the load current value I3, and may be set to a desired value. If it is determined that the counter value N1 is not less than the predetermined value X (step S11: YES), the inhibiting process 1 is terminated. If it is determined that the counter value N1 is less than the predetermined value X (step S11: NO), the timer in the controller 8 starts counting time (step S12). If it is determined that a predetermined time has passed after the time is counted (step S13: YES), the process in step S1 shown in FIG. 2 is performed.

Even if the current sensor diagnostic process is not permitted in a first process for determining whether or not to permit the diagnostic process, because the magnitude of the actual measurement current value I2 is great temporarily, determination is performed plural times at different timings. This makes it possible to permit the current sensor diagnostic process when the magnitude of the actual measurement current value I2 becomes smaller.

Subsequently, an example of the inhibiting process 2 of FIG. 5 will be described. In the inhibiting process 2, it is determined whether or not the data of result of the past current sensor diagnostic process is stored in the internal memory of the controller 8 or an external memory which is accessible by the controller 8 (step S20). If it is determined that the data of the result of the past current sensor diagnostic process is not stored in the memory (step S20: NO), the inhibiting process 2 is terminated. If it is determined that the data of the past current sensor diagnostic process is stored in the memory (step S20: YES), predetermined data is selected from among past data stored in the memory, and is used as the data of the result of the present current sensor diagnostic process (step S21).

In accordance with this, even when the current sensor diagnostic process cannot be executed because the magnitude of the actual measurement current value I2 is great, the installation state of the current sensor 5a(5b) can be estimated by utilizing the data of the result of past current sensor diagnostic process, and correction or the like of the electric power value can be performed appropriately. As the data of the result of the past current sensor diagnostic process selected in step S21, for example, data of result of most recent current sensor diagnostic process may be used.

Alternatively, an inhibiting process including the above inhibiting processes 1 and 2 may be executed. For example, if the number of times (counter value N1) of repetition of the step S1 and the following steps reaches a value which is not less than the predetermined value X, after the inhibiting process 1 is executed (step S11: YES), then the inhibiting process 2 may be executed subsequently.

In a further alternative, to correctly obtain the electric power supplied from the distributed power supply apparatus 4, the above process for determining whether or not to permit the diagnostic process may be executed before start-up of the distributed power supply apparatus 4. In this case, the current sensor diagnostic process is permitted (step S5). And, after the current sensor diagnostic process is actually executed or it is decided that the data of the result of the past diagnostic process is used as the data of the result of the present diagnostic process (step S21), and after the data of the result of the past diagnostic process which is to be actually used is specified, the distributed power supply apparatus 4 may be started-up.

As described above, in the distributed power supply system 3A of Embodiment 1, prior to execution of the current sensor diagnostic process, the process for determining whether or not to permit the diagnostic process is executed. As a result, the current sensor diagnostic process can be executed in a state where accuracy of the current sensor 5a (5b) is guaranteed surely. This makes it possible to attain highly reliable result of the current sensor diagnostic process, and construct the distributed power supply system 3A using the current sensors which have a relatively smaller detected upper limit value, and are inexpensive and small-sized.

Embodiment 2

Figure 6:
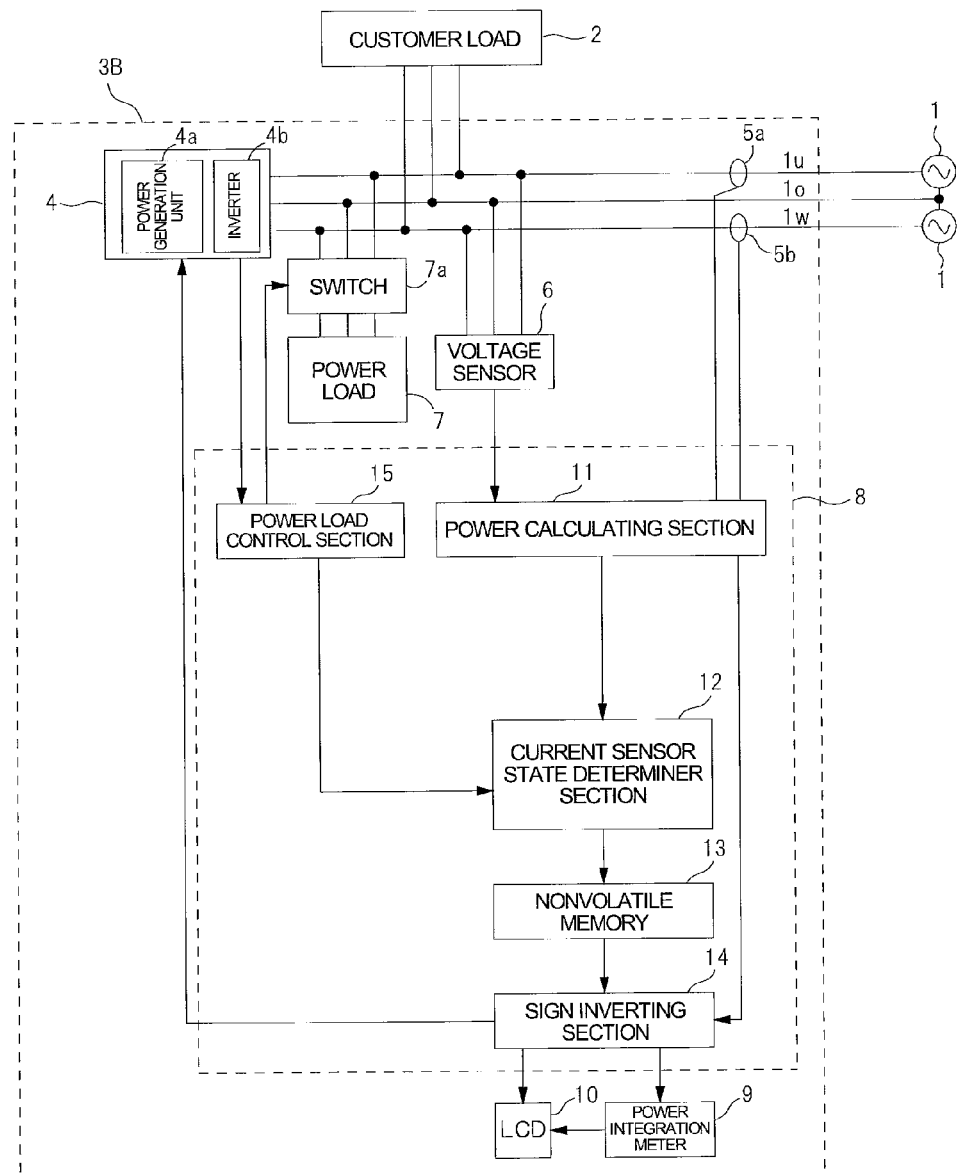
FIG. 6 is a block diagram showing a configuration of a distributed power supply system according to Embodiment 2 of the present invention.

Next, description will be given of a specific configuration of a distributed power supply system 3B and a specific content of a current sensor diagnostic process executed by the distributed power supply system 3B. FIG. 6 is a block diagram showing a configuration of the distributed power supply system 3B according to Embodiment 2. In the distributed power supply system 3B, the distributed power supply apparatus 4 includes a power generation unit 4a and an inverter 4b. The controller 8 includes a power calculating section 11, a current sensor state determination section 12, a nonvolatile memory 13, a sign inverting section 14 and a power load control section 15.

The power calculating section 11 calculates a product of a current value from the current sensor 5a(5b) input to the controller 8 and a voltage value from the voltage sensor 6, to derive electric power for each of U-phase and W-phase. The power load control section 15 controls ON/OFF of the switch 7a. The current sensor state determination section 12 determines an installation state of the current sensor 5a(5b) based on the electric power calculated by the power calculating section 11, the state (ON/OFF) of the switch 7a received as an input from the power load control section 15, etc. In the determination as to the installation state of the current sensor 5a(5b), at least an installation direction of the current sensor 5a(5b) is determined.

The nonvolatile memory 13 stores data of result of determination performed by the current sensor state determiner section 12. The sign inverting section 14 appropriately corrects a sign (inverts a positive/negative sign) of the electric power calculated by the power calculating section 11 based on the data of the result of determination stored in the nonvolatile memory 13.

The distributed power supply system 3B of the present embodiment further includes a power integration meter 9, and a LCD 10 which is a display means and notification means. The power integration meter 9 integrates the electric power which has been calculated by the power calculating section 11 and corrected by the sign inverting section 14 as necessary, to obtain an electric power amount. The LCD 10 includes a power display section for displaying the electric power and the electric power amount, an abnormality display section for displaying an abnormal state of the distributed power supply system 3B, and an abnormality notification section for notifying the abnormal state in the form of a voice, etc.

The other constituents shown in FIG. 6 are identical to those identified by the same reference symbols in FIG. 1 and detailed description will not be given.

Next, the operation of the distributed power supply system 3B of Embodiment 2 configured as described above will be described. The system 3B executes the process for determining whether or not to permit the diagnostic process, like the process of Embodiment 1. The timing at which this process is executed may be set to a time point which is a specified time before start-up of the distributed power supply apparatus 4. To be more specific, in a case where the distributed power supply apparatus 4 decides the start-up timing in real time in response to a demand for electric power in the customer load, the process for determining whether or not to permit the diagnostic process may be executed a specified time before (e.g., 5 minutes before) the distributed power supply apparatus 4 is actually started up. In this case, the start-up time may be decided in view of a time period which passes from when the process for determining whether or not to permit the diagnostic process is initiated until it is completed.

Or, in a case where a time suitable for the start-up of the distributed power supply apparatus 4 is obtained in advance based on learning from a history of demands for electric power in the past, the process for determining whether or not to permit the diagnostic process may be executed at a time point which is a specified time before this time. Or, instead of the above stated time which is the specified time before the start-up of the distributed power supply apparatus 4, the process for determining whether or not to permit the diagnostic process may be executed at a time point when the contracted upper limit value stored in the internal memory of the controller 8 is updated into a new value.

Figure 7:
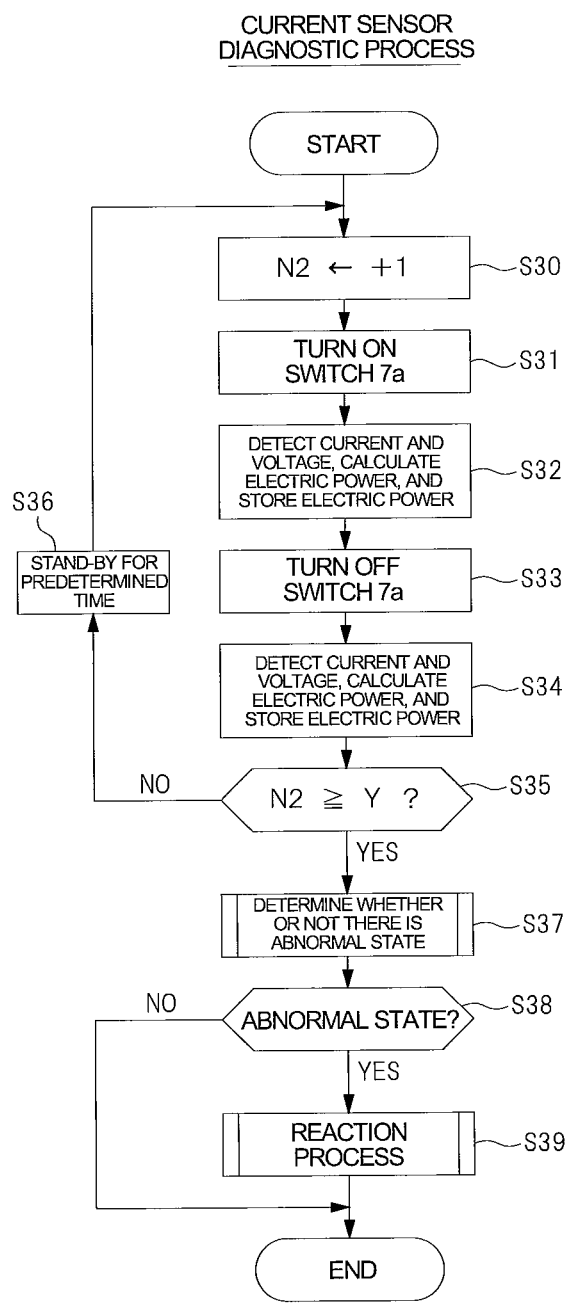
FIG. 7 is a flowchart showing the operation of a controller in a current sensor diagnostic process.

If the current sensor diagnostic process is permitted (step S5 in FIG. 2) after the process for determining whether or not to permit the diagnostic process is executed at a suitable timing as described above, the controller 8 executes the current sensor diagnostic process. FIG. 7 is a flowchart showing the operation of the controller 8 in the current sensor diagnostic process.

As shown in FIG. 7, upon initiating the current sensor diagnostic process, the controller 8 initially increments a counter value N2 by 1 (step S30). Then, the power load control section 15 turns ON the switch 7a (step S31), and supplies the electric power from the commercial power utility 1 to the power load 7 via the electric wires. In this state, the current sensor 5a(5b) detects the current value and the voltage sensor 6 detects the voltage value. The power calculating section 11 calculates the electric power for each of U-phase and W-phase based on the detected data and stores the calculated electric power (step S32).

Then, the power load control section 15 switches the switch 7a to an OFF-state (step S33), and cuts off the electric power supplied from the commercial power utility 1 to the power load 7. Like the process of step S32, in this state, the current sensor 5a(5b) detects the current value, the voltage sensor 6 detects the voltage value, and the power calculating section 11 calculates the electric power for each of U-phase and W-phase based on the detected data and stores the calculated electric power (step S34).

Then, the controller 8 determines whether or not the counter value N2 is not less than a predetermined value Y (step S35). The predetermined value Y is defined as the number of times a process for obtaining the electric power value in the ON-state of the switch 7a and a process for obtaining the electric power value in the OFF-state of the switch 7a are repeated in the current sensor diagnostic process. Therefore, as the predetermined value Y, a numeric value which is not less than 1 may be set, and a numeric value which is not less than 3 may be set suitably. In the present embodiment, it is assumed that the predetermined Y is set to a numeric value which is not less than 3 (3 or more).

If it is determined that the counter value N2 is less than the predetermined value Y in step S35 (step S35: NO), the controller 8 stands-by for a predetermined time (step S36), and then executes step S30 and the following steps. Thus, calculation of the electric power corresponding to the ON-state of the switch 7a and calculation of the electric power corresponding to the OFF-state of the switch 7a are repeated the number of times which is the predetermined value Y preset. Note that the controller 8 stands-by for the predetermined time in step S36 is to prevent the timing at which the electric power is calculated from being synchronized with a change cycle of the electric power supplied to the customer load 2.

The stand-by time may be set to a time suitable for prevention of the above stated synchronization. Equal stand-by time may be set every time step S36 is performed, or a different stand-by time may be set every time step S36 is performed. For example, on the basis of the stand-by time in first step S36, stand-by time which is (2N−1) times as long as the time in this first step S36 may be set for N-th step S36. Or, at least one of a plurality of stand-by times within a time period when calculation of the electric power is performed Y times may be set to a stand-by time other than an integral multiple of another stand-by time of the plurality of stand-by times. To be more specific, the stand-by time in second step S36 may be set to a value which is 1.5 times as long as the stand-by time in first step S36.

On the other hand, if it is determined that the number of times of calculation of the electric power has reached the predetermined value Y (step S35: YES), the controller 8 determines whether or not there is an abnormal state in the current sensor 5a(5b) based on the electric power stored (step S37). If it is determined that there is no abnormal state in the current sensor 5a(5b) (step S38: NO), the controller 8 terminates the current sensor diagnostic process. If it is determined that there is an abnormal state in the current sensor 5a(5b) (step S38: YES), the controller 8 executes a predetermined reaction process (step S39), and terminates the current sensor diagnostic process.

Now, a description will be given of the determination as to whether or not there is an abnormal state in step S37. In Embodiment 2, in the determination as to whether or not there is an abnormal state, it is determined whether or not the installation direction of the current sensor 5a(5b) matches a preset installation direction. In a state where the distributed power supply apparatus 4 is outputting no electric power, when the switch 7a switches from OFF to ON, the electric power supplied from the commercial power utility 1 via the electric wires is increased to meet a demand for supply of the electric power to the power load 7. If the current sensor 5a(5b) is installed correctly, i.e., in a direction matching the set direction, this increased electric power (difference in electric power supplied from the commercial power utility 1 via the electric wires between when the power load 7 is not connected to the electric wires and when the power load 7 is connected to the electric wires) is detected as "positive" electric power correctly. On the other hand, if the current sensor 5a(5b) is installed incorrectly, this increased electric power is not detected as "positive" electric power correctly, but detected as, for example, "negative" electric power.

In the determination as to whether or not there is an abnormal state in step S37, a difference value between the electric power corresponding to ON-state of the switch 7a and the electric power corresponding to OFF-state of the switch 7a is calculated Y times once every when a series of steps S30~S34 are performed. If there are "positive" values plural times in succession, among the difference values of Y times, it is determined that a present installation direction of the current sensor 5a(5b) is "correct", while if there are not "positive" values plural times in succession, it is determined that the present installation direction of the current sensor 5a(5b) is "incorrect."

It may be determined that the present installation direction of the current sensor 5a(5b) is "incorrect," if there are "negative" values plural times in succession, among the difference values of Y times, instead of the above. If there are not "positive" values plural times in succession, among the difference values of Y times, and if there are not "negative" values plural times in succession, among the difference values of Y times, it is assumed that the determination as to the installation direction of the current sensor is impossible, and the current sensor diagnostic process may be executed again from the beginning.

Now, the reaction process in step S39 will be described in detail. The reaction process of the present embodiment is a process executed when the installation direction of the current sensor 5a(5b) is different from a preset installation direction. For example, for a current sensor whose installation direction is incorrect, a positive/negative sign of the detected current value may be inverted. The sign inverting section 14 in the controller 8 inverts the sign. In this way, even if the installation direction of the current sensor 5a(5b) is incorrect, consumed electric power can be obtained accurately without re-installing the current sensor 5a(5b) in a correct direction. In addition to or instead of the above, for example, the LCD 10 may display and notify installation abnormality of the current sensor 5a(5b), or a process for inhibiting the start-up of the distributed power supply apparatus 4 may be executed.

In accordance with the distributed power supply system 3B of Embodiment 2 as described above, like the distributed power supply system 3A of Embodiment 1, the process for determining whether or not to permit the diagnostic process is executed prior to the execution of the current sensor diagnostic process. Therefore, the current sensor diagnostic process can be executed under a condition in which accuracy of the current sensor 5a(5b) is guaranteed surely. As a result, highly reliable result is obtained in the current sensor diagnostic process. In addition, the distributed power supply system 3B can be constructed using current sensors which have a relatively small detected upper limit value, are inexpensive, and are small-sized.

In the current sensor diagnostic process, the electric power value used to determine the installation direction is obtained plural times. Therefore, highly reliable diagnostic result is attained. Since the timing at which the electric power value is obtained is not synchronized with a change cycle of the electric power supplied to the customer load, highly reliable diagnostic result is expected.

Although in the flowchart of FIG. 7, the electric power is calculated in ON-state of the switch 7a before the electric power is calculated in OFF-state of the switch 7a in the steps S31~S34, this order may be reversed.

Embodiment 3

Figure 8:
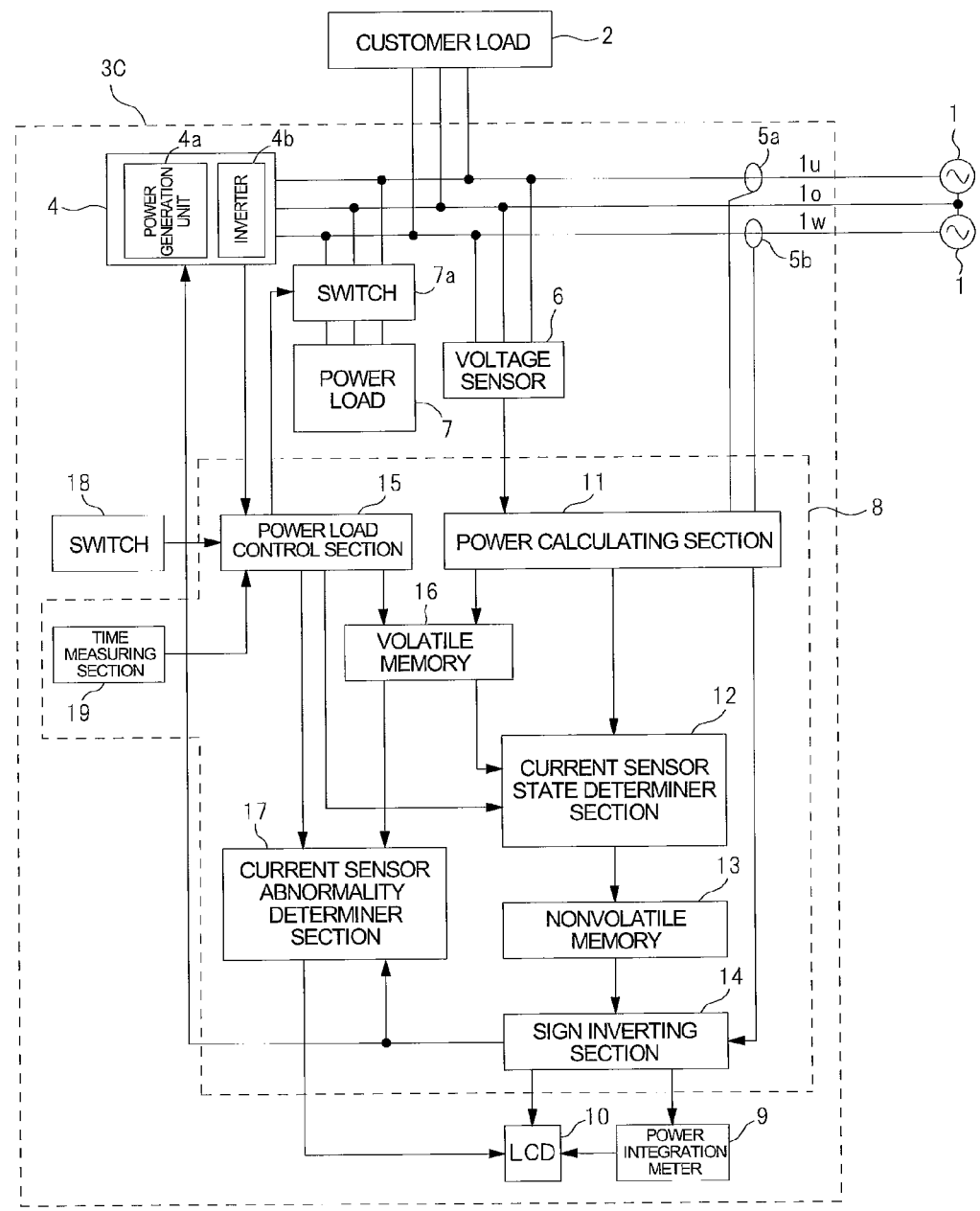
FIG. 8 is a block diagram showing a configuration of a distributed power supply system according to Embodiment 3 of the present invention.

Another specific configuration of a distributed power supply system 3C will be described. FIG. 8 is a block diagram showing a configuration of the distributed power supply system 3C according to Embodiment 3. The distributed power supply system 3C determines whether or not there is an installation problem of the current sensor 5a(5b), disconnection of the winding wire 52, or a failure of current sensor 5a(5b), in the current sensor diagnostic process. As shown in FIG. 8, the distributed power supply system 3C further includes a volatile memory 16, a current sensor abnormality determiner section 17, a switch 18, and a time measuring section 19, which are added to the constituents in the distributed power supply system 3B of Embodiment 2.

The volatile memory 16 is configured to receive signals from the power calculating section 11 and from the power load control section 15 as inputs. The volatile memory 16 is capable of storing the electric power value calculated by the power calculating section 11. The current sensor abnormality determiner section 17 is configured to receive signals from the sign inverting section 14, the power load control section 15 and the volatile memory 16 as inputs. The current sensor abnormality determiner section 17 is configured to determine whether or not there is an installation problem of the current sensor 5a(5b), disconnection of the winding wire 52, or a failure of current sensor 5a(5b), based on the inputs.

The switch 18 is configured to receive an operator's operation command at a timing other than a timing preset in the controller 8, for example, at a timing at which a need for maintenance arises, so that the process for determining whether or not to permit the diagnostic process and the current sensor diagnostic process are executed. In the present embodiment, the switch 18 outputs LOW signal when the switch 17 is not turned ON, while the switch 18 outputs HI signal when the switch 17 is turned ON. The time measuring section 19 is configured to start measurement of a time which passes, at a predetermined timing, and output measurement data to the power load control section 15 at a predetermined timing.

In the distributed power supply system 3C of Embodiment 3, when the switch 18 is turned ON, or a predetermined time passes after a power supply of the system 3C is ON, the process for determining whether or not to permit the diagnostic process and the current sensor diagnostic process are executed. It can be determined that the switch 18 is turned ON by detecting that a signal input from the switch 18 to the power load control section 15 has switched from LOW to HIGH. It can be determined that the predetermined time passes after the power supply of the system 3C is ON, based on the time measured by the time measuring section 19. As described in Embodiment 1 and Embodiment 2, the process for determining whether or not to permit the diagnostic process and the current sensor diagnostic process are executed at suitable timings other than the above, based on a change in a demand for electric power in the customer load or result of learning performed based on a history of past demands for electric power.

The process for determining whether or not to permit the diagnostic process, which is started at the above timing, is as described in detail with reference to FIGS. 2 to 5. The current sensor diagnostic process is permitted only when the difference between the set upper limit value I1 and the actual measurement current value I2 is not less than the load current value I3. Therefore, description of the process for determining whether or not to permit the diagnostic process will be omitted.

In the process for determining whether or not to permit the diagnostic process, when the current sensor diagnostic process is permitted (step S5 in FIG. 2), then the current sensor diagnostic process is executed. In the current sensor diagnostic process executed in the present embodiment, steps S30 to S39 are executed like the process described in detail with reference to FIG. 7 in Embodiment 2. Since determination as to whether or not there is an abnormal state in step S37 is different from that described in Embodiment 2, the determination will be described hereinafter.

In a case where the installation state of the current sensor 5a(5b) has a problem and the current sensor 5a(5b) is unable to detect a current, a case where the current sensor 5a(5b) is disconnected or a fail occurs in the current sensor 5a(5b), or a case where the current sensor 5a(5b) is not installed, a difference between the electric power value in the case where the electric power is supplied to the power load 7 and the electric power value in the case where the electric power is not supplied to the power load 7 is ideally zero. This is true irrespective of whether the distributed power supply apparatus 4 is generating the electric power or is generating no electric power, or irrespective of whether or not the current is flowing reversely if the distributed power supply apparatus 4 is generating the electric power. Therefore, the current sensor abnormality determiner section 17 of the present embodiment obtains a difference value between the electric power corresponding to ON-state of the switch 7a and the electric power corresponding to OFF-state of the switch 7a (see step S34~S34 in FIG. 7). If it is determined that the difference value is within a predetermined value, the current sensor abnormality determiner section 17 determines that there is an abnormal state (step S37 in FIG. 7).

As the predetermined value, a suitable numeric value considering measurement errors of the current sensor 5a(5b) and the voltage sensor 6 may be used. For example, if the difference value is within a range of +100 W~−100 W, it may be determined that there is an abnormal state. Or, the switch 7a is turned ON and the electric power (or predicted value of the electric power) supplied to the power load 7 is obtained in a case where there is no abnormal state in the current sensor 5a(5b). And, if the above difference value is not greater than this value (or predetermined value derived from this value), it may be determined that there is an abnormal state.

As a result of the above determination (step S37), if it is determined that there is an abnormal state (step S38: YES), the reaction process (step S39) is executed. In the reaction process in step S39, for example, information indicating that there is an abnormal state is displayed or is notified on the LCD 10, or start-up of the distributed power supply apparatus 4 is inhibited, which process is executed appropriately.

In accordance with the distributed power supply system 3C of Embodiment 3 as described above, like the distributed power supply system 3A of Embodiment 1, the process for determining whether or not to permit the diagnostic process is executed prior to the execution of the current sensor diagnostic process. Therefore, the current sensor diagnostic process can be executed under a condition in which accuracy of the current sensor 5a(5b) can be guaranteed surely. As a result, highly reliable result is obtained in the current sensor diagnostic process. In addition, the distributed power supply system 3C can be constructed using current sensors which have a relatively small detected upper limit value, are inexpensive, and are small-sized.

In the present embodiment, in the current sensor diagnostic process, the installation problem of the current sensor 5a(5b) can be detected in the installation of the system 3C, maintenance work of the system 3C, etc., and after the system 3C is installed correctly, disconnection or a failure of the current sensor 5a(5b) can be detected. By operating the switch 18, the process for determining whether or not to permit the diagnostic process and the current sensor diagnostic process can be executed at proper timings desired by the operator. Therefore, installation construction or maintenance work of the system 3C can be carried out smoothly. By using the time measuring section 19, the process for determining whether or not to permit the diagnostic process and the current sensor diagnostic process can be executed automatically at preset timings. Therefore, irrespective of the demand for electric power, and without a need for the operator to operate the switch 18, the process for determining whether or not to permit the diagnostic process and the current sensor diagnostic process can be executed automatically, which improves convenience. Note that the installation direction of the current sensor 5a(5b) may also be diagnosed, like Embodiment 1.

Embodiment 4

Figure 9:
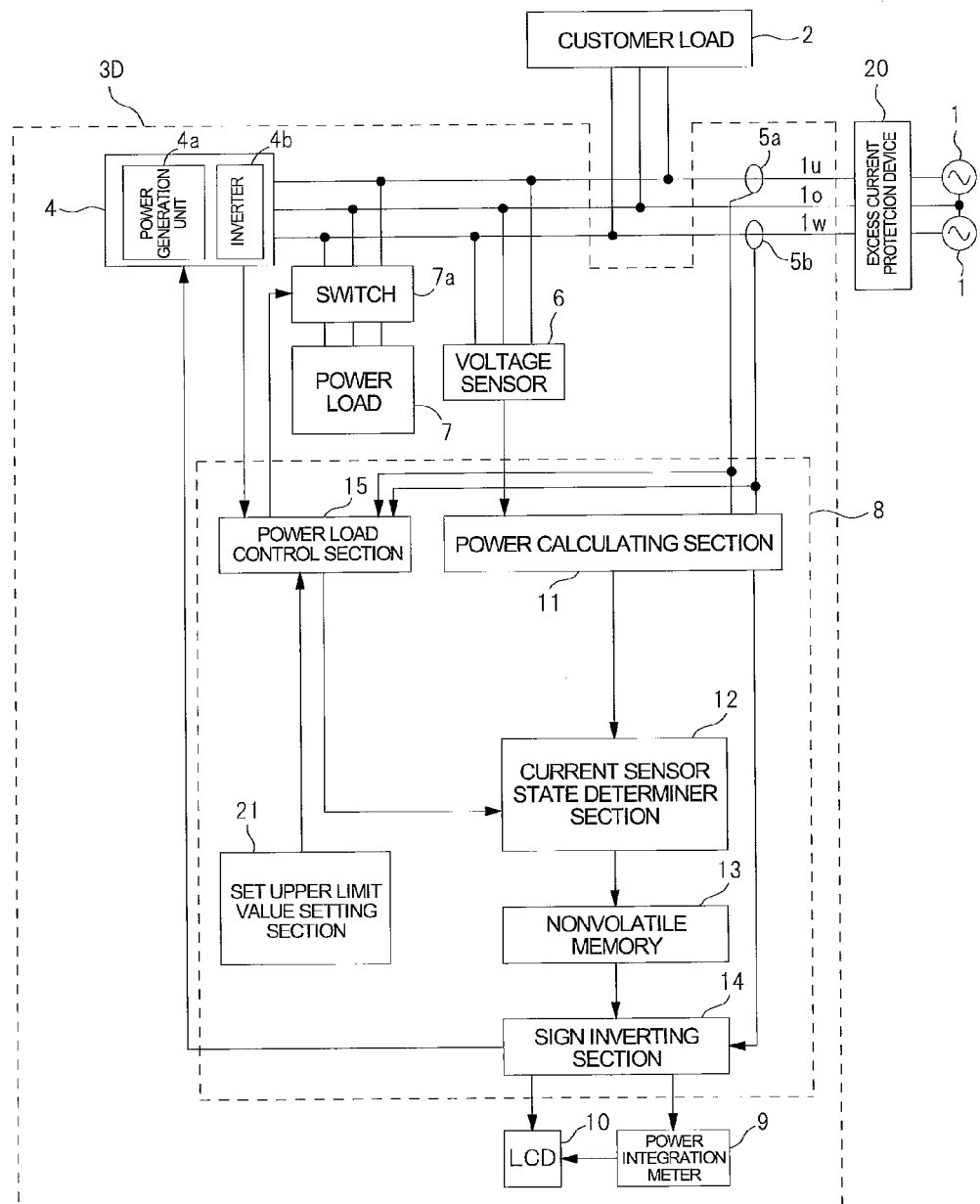
FIG. 9 is a block diagram showing a configuration of a distributed power supply system according to Embodiment 4 of the present invention.
Figure 10:
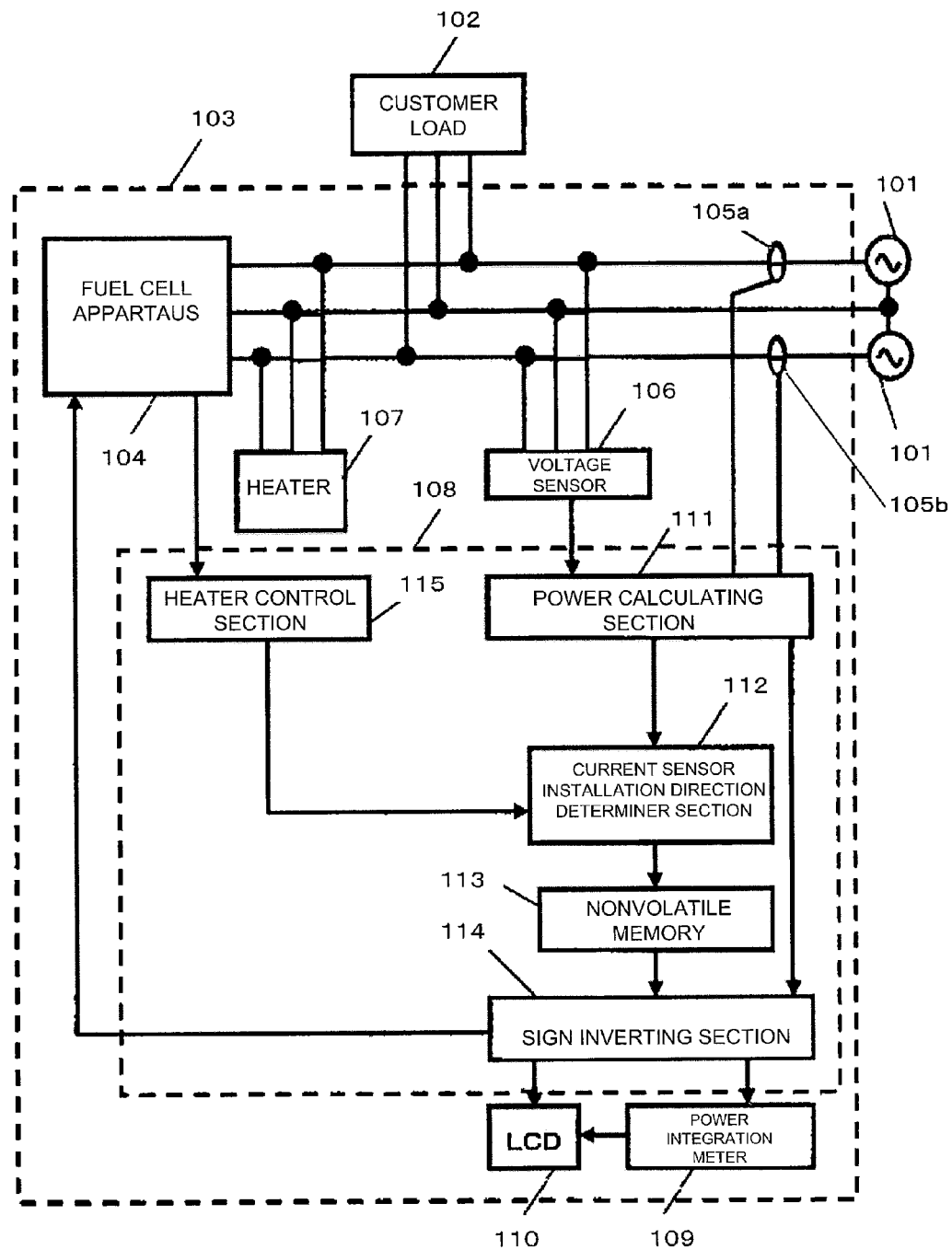
FIG. 10 is a block diagram showing a configuration of a conventional distributed power supply system.

Another specific configuration of a distributed power supply system will be described. FIG. 9 is a block diagram showing a configuration of a distributed power supply system 3D according to Embodiment 4 of the present invention. The distributed power supply system 3D of Embodiment 4 is configured such that a constituent for required for the process for determining whether or not to permit the diagnostic process based on the set upper limit value described Embodiment 1 is specifically incorporated into the system 3B of Embodiment 2. The distributed power supply system 3D and the customer load 2 of the present embodiment are interactively connected to the commercial power utility 1 via an excess current protection device 20. The system 3D differs from distributed power supply system 3B according to Embodiment 2 in that the controller 8 includes a set upper limit value setting section 20, and in a connection point between the customer load 2 and the electric wires.

To be specific, the excess current protection device 20 cuts off a current supplied from the commercial power utility 1 if a value of the current flowing when the electric power is consumed in the customer load 2 exceeds a current value ("contracted upper limit value": see Embodiment 1) contracted with a power company. The set upper limit value setting section 21 stores at least one of the detected upper limit value of the current sensor 5a(5b), the contracted upper limit value decided by contact with the power company, and a predetermined value less than the contracted upper limit value, by the operator's operation and setting.

In the distributed power supply system 3D of the present embodiment, on the electric wires from the distributed power supply apparatus 4 to the commercial power utility 1, the switch 7a, the voltage sensor 6, the customer load 2, and the current sensors 5a, 5b are provided in this order when viewed from the distributed power supply apparatus 4. However, like Embodiment 1 to Embodiment 3, the switch 7a, the customer load 2, the voltage sensor 6, and the current sensors 5a, 5b may be provided in this order when viewed from the distributed power supply apparatus 4.

The process for determining whether or not to permit the diagnostic process in the distributed power supply system 3D is similar to that described with reference to FIGS. 2 to 5 in Embodiment 1, and the determination in step S4 of FIG. 2 is performed using as the set upper limit value I1, the detected upper limit value, the contracted upper limit value or the predetermined value which are stored in the upper limit value setting section 21. If the value of the current flowing when the electric power supplied from the commercial power utility 1 exceeds the contracted upper limit value, the excess current protection device 20 is actuated to cut off the current thereafter.

Although the distributed power supply system including the three-phase three-wire electric circuit has been described above, the present invention is not limited to this, but a distributed power supply system including, for example, a single-phase two-wire electric circuit or a distributed power supply system including a two-phase three-wire electric circuit, may be used.

INDUSTRIAL APPLICABILITY

The present invention is suitably applied to a distributed power supply system which supplies electric power to a power demand site separately from a commercial power utility, and a control method thereof.

The invention claimed is:

1. A distributed power supply system which supplies electric power to a power demand site separately from a commercial power utility, said system comprising:
    a distributed power supply apparatus connected to the commercial power utility via an electric wire and configured to supply the electric power to the power demand site;
    a power load supplied with the electric power from the commercial power utility via the electric wire;
    a current sensor connected to the electric wire and configured to detect a magnitude and a direction of a current flowing through the electric wire; and
    a controller configured to execute a diagnostic process of the current sensor based on a difference between a detected current value of the current sensor in a state where the electric power is supplied to the power load and a detected current value of the current sensor in a state where the electric power is not supplied to the power load;
    wherein the controller executes a process for determining whether or not to permit the diagnostic process in such a manner that the controller determines whether or not a difference between a set upper limit value and an actual measurement current value is not less than a load current value, the set upper limit value being a predetermined upper limit value set with respect to a detected current of the current sensor, the actual measurement current value being detected by the current sensor in a state where the diagnostic process is not executed, and the load current value being a value of a current flowing from the commercial power utility to the power load during execution of the diagnostic process; and if it is determined that the difference is not less than the load current value, the controller permits the diagnostic process.

2. The distributed power supply system according to claim 1,
wherein the set upper limit value is a detected upper limit value which is an upper limit value up to which the current sensor exhibits linearity between the detected current value of the current sensor and an output voltage value of the current sensor, a contracted upper limit value defined as a value which is not greater than the detected upper limit value as an upper limit value of the current supplied from the commercial power utility to the power demand site, or a predetermined value less than the contracted upper limit value.

3. The distributed power supply system according to claim 2,
wherein the current sensor includes a ring core into which the electric wire is inserted; a winding wire wound around the ring core; and a resistive element connected between both ends of the winding wire; and
wherein the detected upper limit value is set to correspond to an upper limit voltage value in an allowable applied voltage range of the resistive element.

4. The distributed power supply system according to claim 1,
wherein if it is determined that the difference is less than the load current value in the process for determining whether or not to permit the diagnostic process, the controller executes the process for determining whether or not to permit the diagnostic process again at a predetermined timing.

5. The distributed power supply system according to claim 1,
wherein if it is determined that the difference is less than the load current value in the process for determining whether or not to permit the diagnostic process, the controller inhibits the diagnostic process, and uses data of result of a past diagnostic process as data of result of a present diagnostic process.

6. The distributed power supply system according to claim 5,
wherein the controller executes the process for determining whether or not to permit the diagnostic process before start-up of the distributed power supply apparatus, and
wherein (1) if it is determined that the difference is not less than the load current value, the controller executes the diagnostic process, and then starts-up the distributed power supply apparatus, or
wherein (2) if it is determined that the difference is less than the load current value, the controller decides that the data of the result of the past diagnostic process is used as the data of the result of the present diagnostic process, and then starts-up the distributed power supply apparatus.

7. The distributed power supply system according to claim 1,
wherein the diagnostic process includes a sensor state detecting process for detecting at least one of states which are (1) an installation direction of the current sensor; (2) a state of a position of the current sensor installed on the electric wire; (3) a state of a failure of the current sensor; and (4) a state in which the current sensor is attached on or detached from the electric wire.

8. The distributed power supply system according to claim 1,
wherein the controller is configured to execute the diagnostic process three or more times in succession at specified time intervals in such a manner that at least one time interval is set to a time interval which is other than an integral multiple of another time interval.

9. The distributed power supply system according to claim 1,
wherein the distributed power supply apparatus includes a power generation unit for generating DC power, and an inverter which converts the DC power generated by the power generation unit into AC power and outputs the AC power to the electric wire; and
wherein the power load is a power heater supplied with the AC power via the inverter.

10. A method of controlling a distributed power supply system including a distributed power supply apparatus which supplies electric power to a power demand site separately from a commercial power utility, a current sensor for detecting a current flowing through an electric wire connecting the commercial power utility and the distributed power supply apparatus to each other; and a power load supplied with the electric power from the commercial power utility via the electric wire, the method comprising the steps of:
obtaining a set upper limit value which is a predetermined upper limit value set with respect to a detected current of the current sensor;
obtaining an actual measurement current value detected by the current sensor in a state where a predetermined diagnostic process relating to diagnosis of the current sensor is not executed;
obtaining a load current value which is a value of a current flowing from the commercial power utility to the power load during execution of the diagnostic process;
determining whether or not a difference between the set upper limit value and the actual measurement current value is not less than the load current value; and
permitting the diagnostic process if it is determined that the difference is not less than the load current value.

* * * * *